United States Patent
Townsend et al.

(10) Patent No.: US 10,731,986 B2
(45) Date of Patent: Aug. 4, 2020

(54) DIGITAL CONTROLLED VCO FOR VIBRATING STRUCTURE GYROSCOPE

(71) Applicant: Atlantic Inertial Systems Limited, Plymouth, Devon (GB)

(72) Inventors: Kevin Townsend, Liskeard (GB); Michael Durston, Plymouth (GB)

(73) Assignee: ATLANTIC INERTIAL SYSTEMS LIMITED, Plymouth, Devon (GB)

( * ) Notice: Subject to any disclaimer, the term of this patent is extended or adjusted under 35 U.S.C. 154(b) by 26 days.

(21) Appl. No.: 15/522,402

(22) PCT Filed: Oct. 27, 2015

(86) PCT No.: PCT/GB2015/053219
§ 371 (c)(1),
(2) Date: Apr. 27, 2017

(87) PCT Pub. No.: WO2016/067014
PCT Pub. Date: May 6, 2016

(65) Prior Publication Data
US 2017/0322029 A1   Nov. 9, 2017

(30) Foreign Application Priority Data

Oct. 27, 2014 (GB) .................................. 1419071.4

(51) Int. Cl.
*G01C 19/5776* (2012.01)
*G01C 19/66* (2006.01)
*H03L 7/099* (2006.01)

(52) U.S. Cl.
CPC ......... *G01C 19/5776* (2013.01); *G01C 19/66* (2013.01); *H03L 7/0991* (2013.01)

(58) Field of Classification Search
CPC .................... G01C 19/5776; H03L 7/0991
USPC ..................... 73/504.02, 504.12, 514.15
See application file for complete search history.

(56) References Cited

U.S. PATENT DOCUMENTS

| 3,753,141 A | 8/1973 | Van Elk et al. |
| 4,520,327 A | 5/1985 | Myers |
| 5,361,036 A | 11/1994 | White |
| 5,424,735 A * | 6/1995 | Arkas ................. H03M 1/12 341/144 |
| 2011/0133794 A1 | 6/2011 | Dunworth et al. |

FOREIGN PATENT DOCUMENTS

| EP | 0859219 A2 | 8/1998 |
| EP | 1015849 A1 | 7/2000 |
| EP | 2469228 A1 | 6/2012 |

(Continued)

OTHER PUBLICATIONS

IPO Search Report for International Application No. GB1419071.4, dated Apr. 24, 2015, 1 page.

(Continued)

*Primary Examiner* — Benjamin R Schmitt
(74) *Attorney, Agent, or Firm* — Cantor Colburn LLP

(57) ABSTRACT

A digitally controlled voltage controlled oscillator comprising an Nbit digital to analogue convertor arranged to receive a frequency change demand signal as a digital Nbit word, and having an output provided via an integrator to a voltage controlled oscillator configured to provide a frequency output.

6 Claims, 8 Drawing Sheets

(56) References Cited

FOREIGN PATENT DOCUMENTS

JP            2012013529 A     1/2012
JP            2004297616 A     10/2019

OTHER PUBLICATIONS

PCT International Search Report and Written Opinion of the International Searching Authority, or the Declaration for International Application No. PCT/GB2015/053219, dated Feb. 3, 2016, 13 pages.
Abstract of JP2004297616, published Oct. 21, 2004, 1 page.
Claim Translation of JP2004297616, published Oct. 21, 2004, 2 pages.
Description Translation of JP2004297616, published Oct. 21, 2004, 7 pages.
JP Office Action for Patent Application No. JP 2017-522922, dated Mar. 26, 2019, 6 pages (English Translation).
JP Office Action for Patent Application No. JP 2017-522922, dated Mar. 26, 2019, 7 pages.

\* cited by examiner

DIGITAL CONTROLLED VCO FOR VIBRATING STRUCTURE GYROSCOPE

CROSS REFERENCE TO RELATED APPLICATIONS

This is a US National Stage of Application No. PCT/GB2015/053219, filed on Oct. 27, 2015, which claims the benefit of GB Application No. 1419071.4 filed Oct. 27, 2014, the disclosures of which are incorporated herein by reference.

The present invention is concerned with providing a digitally controlled reference oscillator for a vibrating structure gyroscope system.

Vibrating structure gyroscopes function as a result of Coriolis forces which are developed when a particle undergoes linear motion in a rotating frame of reference. These so-called Coriolis gyroscopes or gyros rely on the resonant characteristics of their structure and are driven at their natural resonant frequency to produce a linear velocity component from which applied angular rates can produce Coriolis acceleration. These Coriolis accelerations are coupled within the mechanical structure and are used to excite a second vibration mode which is then proportional to the applied angular rate. From the vibrations, therefore, the applied angular rate can be determined.

Vibrating structure gyroscopes have been constructed using various different mechanical vibratory structures, including beams, tuning forks, cylinders, hemispherical shells and rings. A common feature is that all structures are required to maintain a resonance carrier mode oscillation at a natural, resonant frequency determined by the mechanical vibratory structure. As mentioned above, this provides the linear momentum which produces Coriolis forces when the gyro is rotated around the appropriate axis. One example of a vibrating structure gyroscope using the Coriolis affect is described in EP 0859219.

Control loops are applied to control the vibration produced while resonating at the natural, resonance frequency, and are required to extract the desired angular rate information.

There are difficulties in ensuring that the structure is resonating at precisely its natural, resonance frequency and that the control loops are using outputs due to resonance at that frequency. The natural bandwidth of such resonant structures is generally very small and is determined by the equation $F_{bw}=Fr/2Q$. For a typical 14 kHz resonator with a Q of 5000, therefore, the natural bandwidth would only be 1.4 Hz.

Because the bandwidth is so small, many errors arise within such systems, the most significant of which is the Quadrature bias produced by mismatches in the resonant frequency of the driven (primary) mode and the response (secondary) mode frequencies. Here, even a 1 Hz frequency difference produces typically 225 deg/second Quadrature bias. Quadrature bias is a signal at 90° phase to the required rate signal and needs to be identified and discarded in the output signal in order to accurately determine the angular rate information. To accurately identify and reject the Quadrature bias error, very accurate timing of the 0° and 90° phase references is required.

These accurate phase references are typically produced using a Phase Lock Loop (PLL) system synchronised to the resonator signal but using a higher frequency reference oscillator and accurate digital frequency divider circuits to produce all the required phase reference signals. These references need to be accurate to small fractions of a degree, with targets of less than 0.05 degree being common for medium performance systems. This is discussed further below with reference to the drawings.

To achieve high performance systems it is usual to use a largely digital implementation to enable repeatable manufacture and complex compensations to be applied. A digitally controlled reference oscillator is then required and its resolution and accuracy can be defined to match the required performance. A typical digital gyro control system is described in EP 1015849 and discussed further below. For digital gyro systems, the digital control of the reference oscillator becomes the significant performance-limiting factor, due to the finite word length and limited resolution of the frequency adjustment. It is also known that gyro bias performance can be significantly improved by increasing mechanical Q of the resonator. This, however, sets even more stringent requirements on the accuracy and resolution of the reference oscillator, going beyond what can be achieved using existing techniques.

Currently, resonators can be produced with much higher Q values than previously, for example with ten times more Q than previous sensors. This, however, requires at least a 10-fold increase in the accuracy of resolution of the reference oscillators, using existing control systems. A system using, for example, a 14 kHz resonator at a reference of less than 0.005 degree would be equivalent to a timing error of 1 ns and would require at least a 1000 MHz clock if implemented using a digital synthesizer. In addition, the bandwidth of the resonator is also ten times smaller, so even greater resolution is required to fully exploit the performance potential of such new improved resonators. Clearly, such improvements are not easily achievable, using existing technology.

The present invention, therefore, provides a digitally controlled reference oscillator where the phase, rather than the frequency, can be controlled. This dramatically reduces the instantaneous error in timing which controls the timing of the sampling and, therefore, the accuracy of the entire system.

The present invention provides a directly phase controlled reference oscillator that can simultaneously track the initial (primary) resonant frequency of the resonator and can track changes in the resonant frequency, e.g. due to temperature and other effects, all with a very high resolution, satisfying the needs mentioned above. The reference oscillator is then able to adapt to changes in the resonant frequency, to ensure that the structure is always being vibrated at that frequency and the readings taken from it for determination of the rate signal and quadrature bias information are accurate.

The invention achieves this by providing a reference oscillator comprising a digitally controlled voltage controlled oscillator comprising an Nbit digital to analogue convertor arranged to receive a frequency change demand signal as a digital Nbit word, and having an output provided via an integrator to a voltage controlled oscillator configured to provide an in-phase frequency output and a quadrature phase frequency signal output.

With this structure, the VCO input is no longer directly quantised by the limited resolution of the DAC as in existing systems. The DAC output then controls the rate of change of frequency and can, therefore, be scaled to control the phase to a very high resolution.

This enables the dynamic range of the phase control parameter, which is limited and quantised by the available DAC resolution, to be set independently of the frequency adjustment. The phase control needs only to respond to very slow changes in frequency due to temperature variations and the like and can, therefore, have a very low gain and, therefore, high resolution. The range of frequency adjustment can remain large so as to cover the full range of tolerances of the resonator and VCO natural frequency.

Preferred embodiments will now be described by way of example only and with reference to the drawings.

Figure 1:
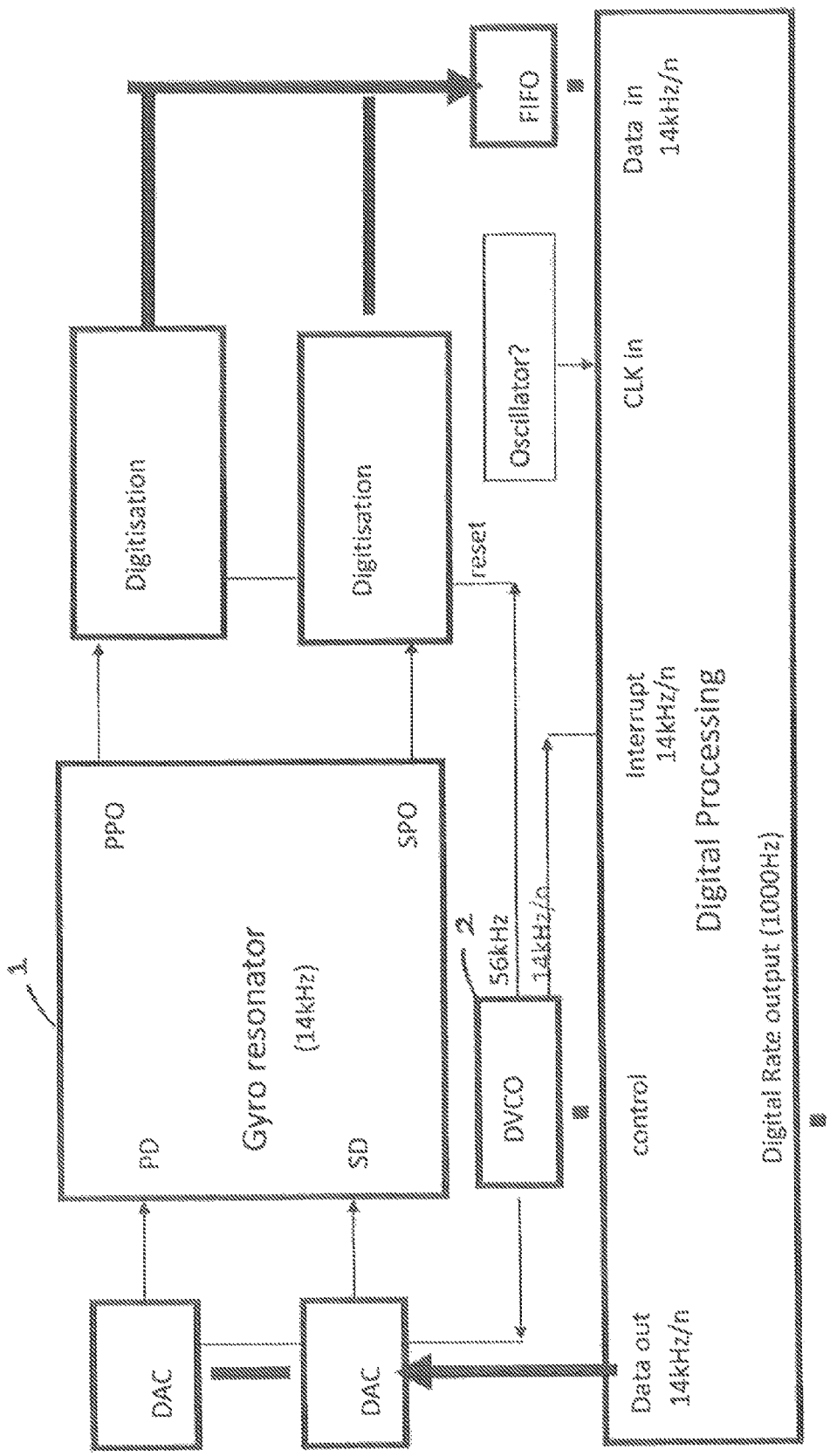
FIG. 1 shows a block diagram of a digital gyro control system disclosed in EP 1015849.
Figure 2:
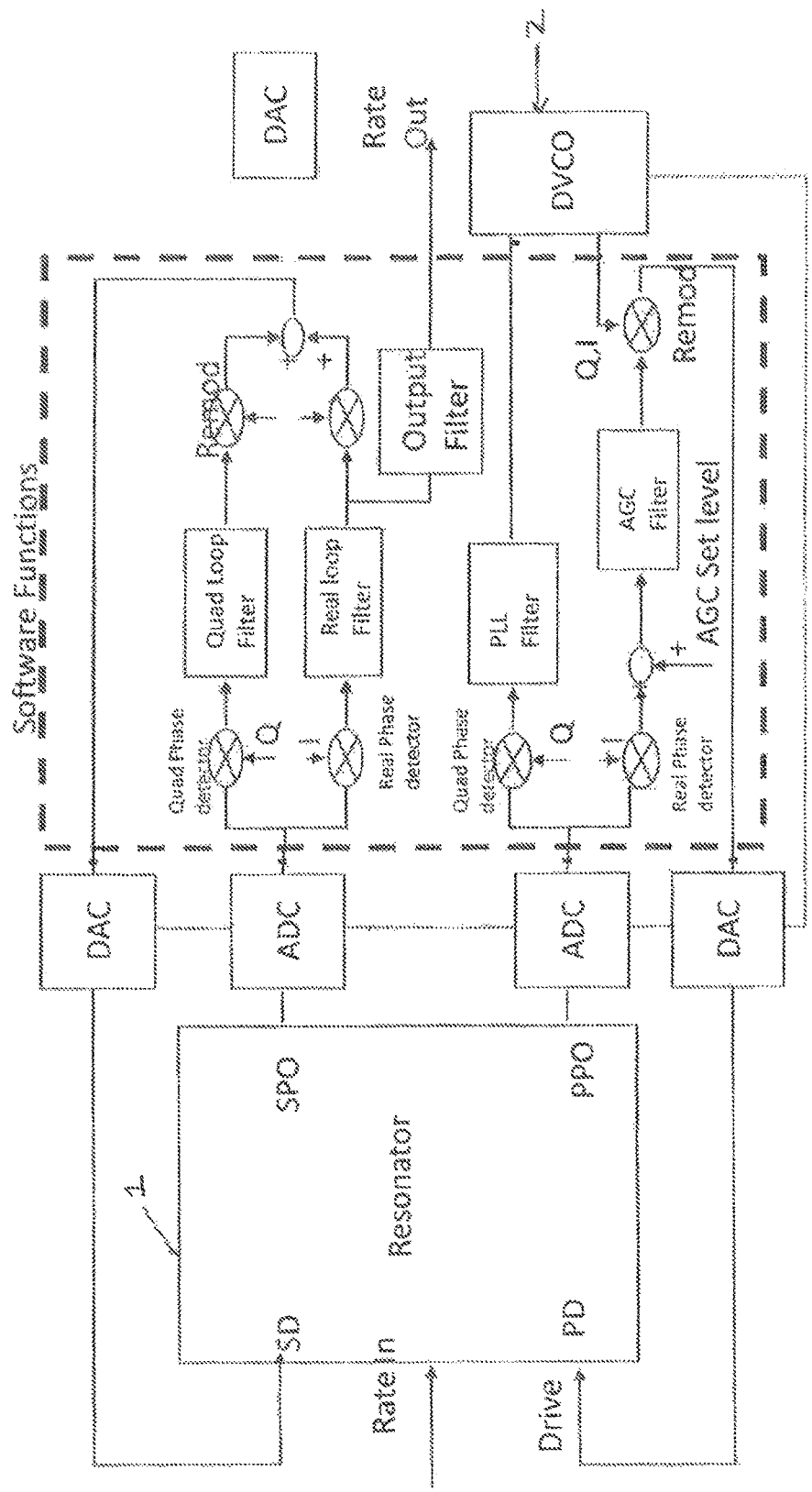
FIG. 2 shows a block diagram of a digital gyro control system showing details of the control loops.

FIG. 1 is a block diagram of a general digital gyro control system such as that described in EP 1015849. FIG. 2 shows a block diagram of an alternative typical digital gyro control system showing the control loops in more detail. The primary loop operates by applying a drive signal to the input of the resonator (PD) at the frequency defined by the DVCO_2 (i.e. the frequency considered to be the natural frequency of the resonator). The primary axis pickoff signal at PPO is converted to a digital value and is split into two loops at 90° phase to each other. One loop controls the attitude of motion on the primary axis, via a real phase detector and AGC (automatic gain control) filter. The other loop controls the frequency of the applied drive signal to lock the frequency to the resonator's resonant frequency, via a phase lock loop (PLL). The secondary or response loop detects the motion coupled from the primary axis into the secondary axis during Coriolis and therefore has a signal that is proportional to rate. The secondary loop applies a drive signal to the secondary axis at SD to null the motion. At SPO, the pickoff signal is converted to a digital value and is also separated into a real and a quadrature phase signal. The real part of the signal is proportional to the rate. This is then derived at the output "rate out" for further processing.

Figure 3:
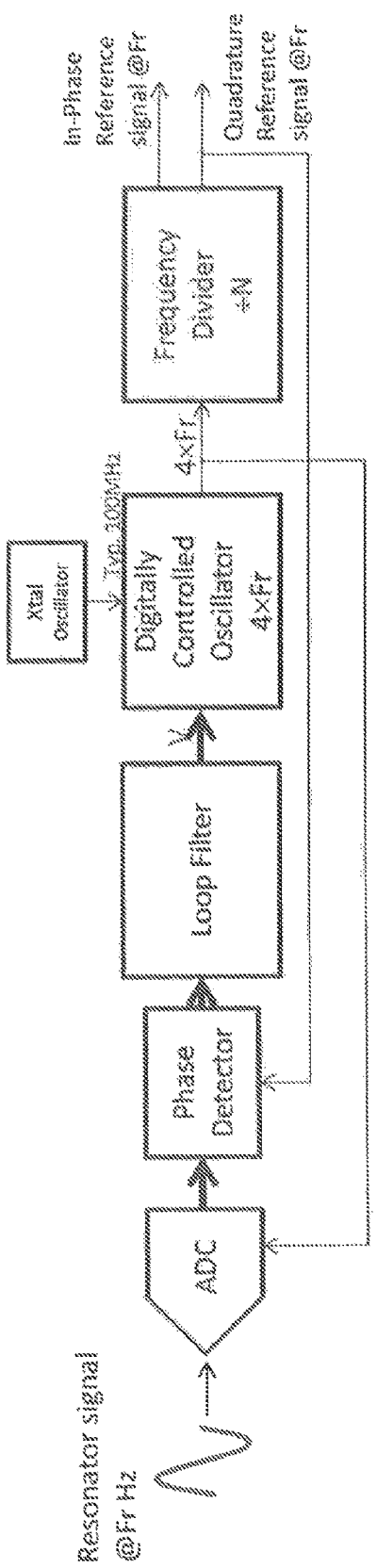
FIG. 3 shows in more detail the digitally controlled phase lock loop part of a system such as shown in FIG. 2.

FIG. 3 shows in more detail the phase lock loop for processing the signal from the PPO output of the resonator as described in relation to FIGS. 1 and 2. As mentioned above, the primary pickoff signal from the resonator is digitised by the ADC and is processed within the digital domain. Within the digital domain, the signal is passed through a phase detector (quad phase detector of FIG. 2) to create an error signal proportional to the phase error. This is passed through the digital loop filter, which includes an integrator, into a digital synthesised oscillator, where the resolution is defined by the Xtal clock frequency. This typically operates at n times the resonant frequency to provide the necessary clocks for sampling. To provide all of the necessary clocks, the output of the digital controlled oscillator is divided by a frequency divider. One output is used as the in-phase reference signal and the other as the quadrature reference signal.

Figure 5:
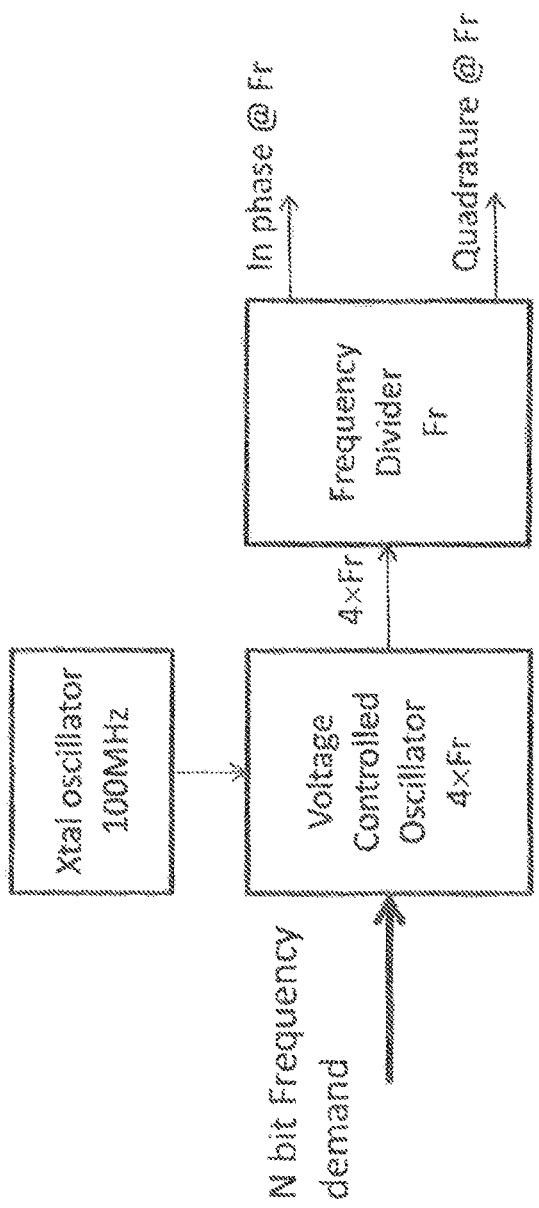
FIG. 5 shows in more detail the digital synthesizer based VCO used in the loop shown in FIG. 3.

FIG. 5 shows a more detailed block diagram for the digitally synthesized VCO of the loop shown in FIG. 3. This gives an example of the typical frequency for the resonant frequency and the typical expected tolerance that would need to be provided by the oscillator. If for example, a 16 bit number is used over the frequency range, it appears that the resolution is 0.0076 Hz/lsb however this is, as mentioned above, limited by the resolution of the Xtal clock frequency. If the Xtal frequency is, for example, 100 MHz, then the clock edges occur at 0.01 microsecond intervals. This converts into a period change equivalent to 8 Hz and, therefore, the resolution would, in fact, be more like 8 Hz. This shows the problems associated with use of such a digital synthesizer.

Figure 4:
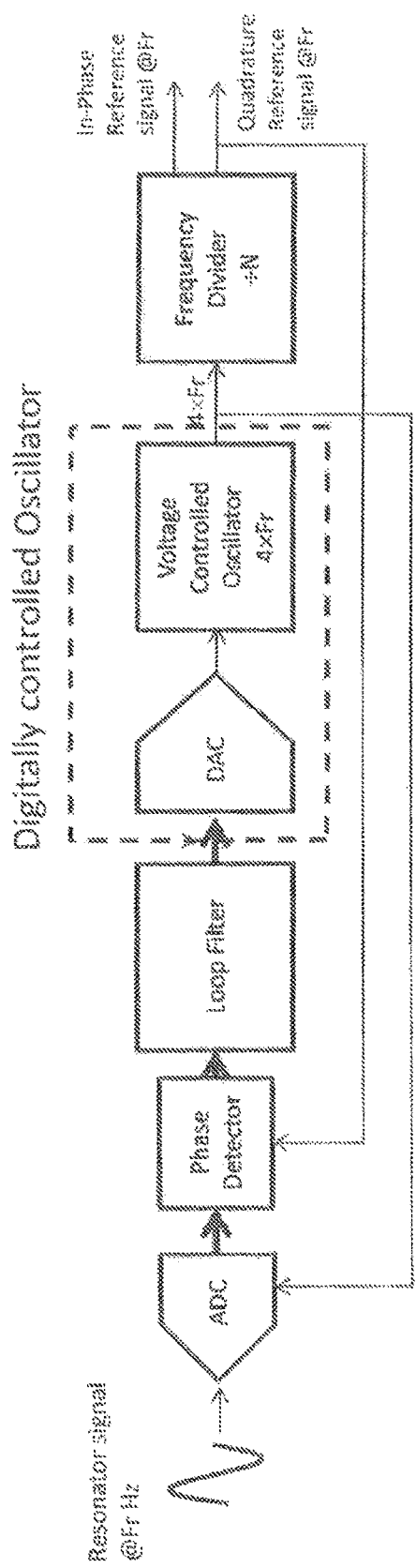
FIG. 4 shows in more detail an alternative digitally controlled phase lock loop part of a system such as shown in FIG. 2.

An alternative phase lock loop system for use in a system such as described in FIGS. 1 and 2, is shown in FIG. 4, which shows a digital phase lock loop, similar to that of FIG. 3. Instead of using the Xtal oscillator of FIG. 3, however, because of the limited resolution due to the Xtal clock frequency, a digitally controlled analogue VCO is used in the loop. With such a digitally controlled VCO, the resolution of the system is limited only by the number of bits of the DAC used to control the operating frequency and the scaling (required frequency range) of the VCO.

Again, as with the phase lock loop of FIG. 3, the primary pickoff signal from the resonator is digitised by the ADC and processed within the digital domain. Within the digital domain, the signal is passed through a phase detector to create an error signal proportional to the phase error. This is passed through the digital loop filter, which includes an integrator, and the output of the filter provides a digital value to the DAC within the digitally controlled oscillator. The output of the DAC controls the voltage controlled oscillator which, again, is typically operated at n times the resonant frequency to ensure all the necessary clock signals are available to allow the necessary sampling.

Figure 6:
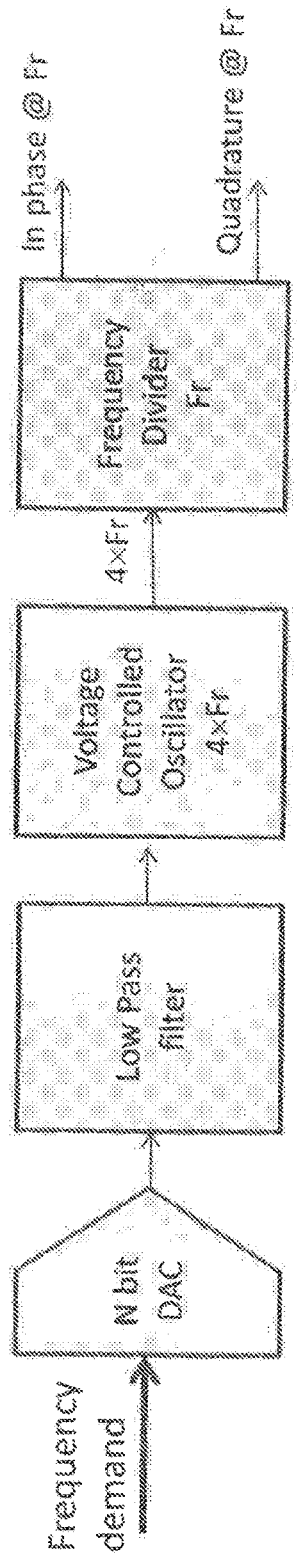
FIG. 6 shows in more detail the digitally controlled analogue VCO used in the loop shown in FIG. 4.

FIG. 6 provides more detail of an example using a digitally controlled voltage controlled oscillator such as shown in FIG. 4. Again, if a 16 bit number is initially used over the frequency range, this has a resolution of 0.0076 Hz/lsb which equates to a phase setting error of 2.7367 s/lsb (2.736° when considered over a 1 second period). The low pass filter between the NDAC and VCO provides high frequency filtering of the DAC quantised output and together with the overall loop bandwidth can average this error to a smaller value of typically 0.02°. Again, this illustrates, by way of an example, the resolution problems existing reference oscillator designs.

Figure 7:
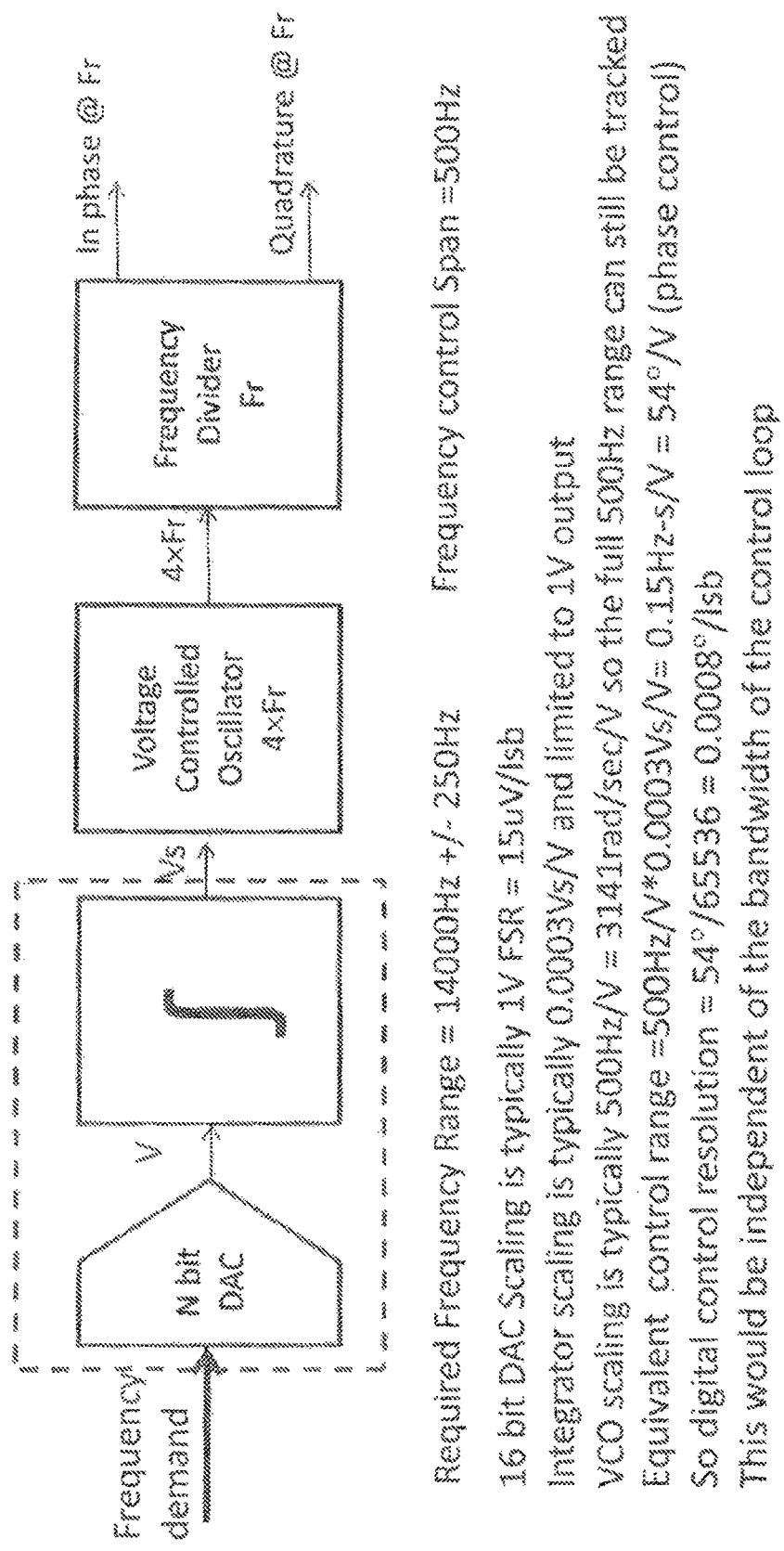
FIG. 7 is a block diagram of a high resolution digitally controlled analogue VCO oscillator according to the invention.

FIG. 7 is a block diagram showing an example of a reference oscillator according to the present invention. This provides improvements over oscillators such as shown in FIGS. 3 to 6, described above.

Here, rather than the integrator function being incorporated in the digital filter between the input and the VCO, as in the above-described systems, the integrator is removed from the loop filter (digital domain) and, instead, is placed between the Nbit DAC and the VCO where it operates as a continuous time, analogue function with no quantisation errors.

In the example given, by placing the integrator in this position, the resolution is increased significantly without the need to increase the number of bits of the DAC. For a 16-bit number, the DAC resolution is typically 15 µV/lsb. Given a VCO scaling of typically 500 Hz/V the resolution would have been 0.0076 Hz equating to a phase resolution of 0.0076*360=2.7°/s/lsb. However, with this integrator scaling of typically 0.0003 Vs/V the resolution would be 0.0076*0.0003=2.28 µHz-second/lsb or the phase resolution would be 2.28 µ*360=0.0008 deg/lsb. If the integrator range is limited to 1V output the full 500 Hz range can, therefore, still be tracked.

Thus, compared, for example, to the prior art arrangement of FIG. 4, the integrator function is moved from the PLL filter (as seen in FIG. 1) to within the VCO and between the DAC and the VCO.

Figure 8:
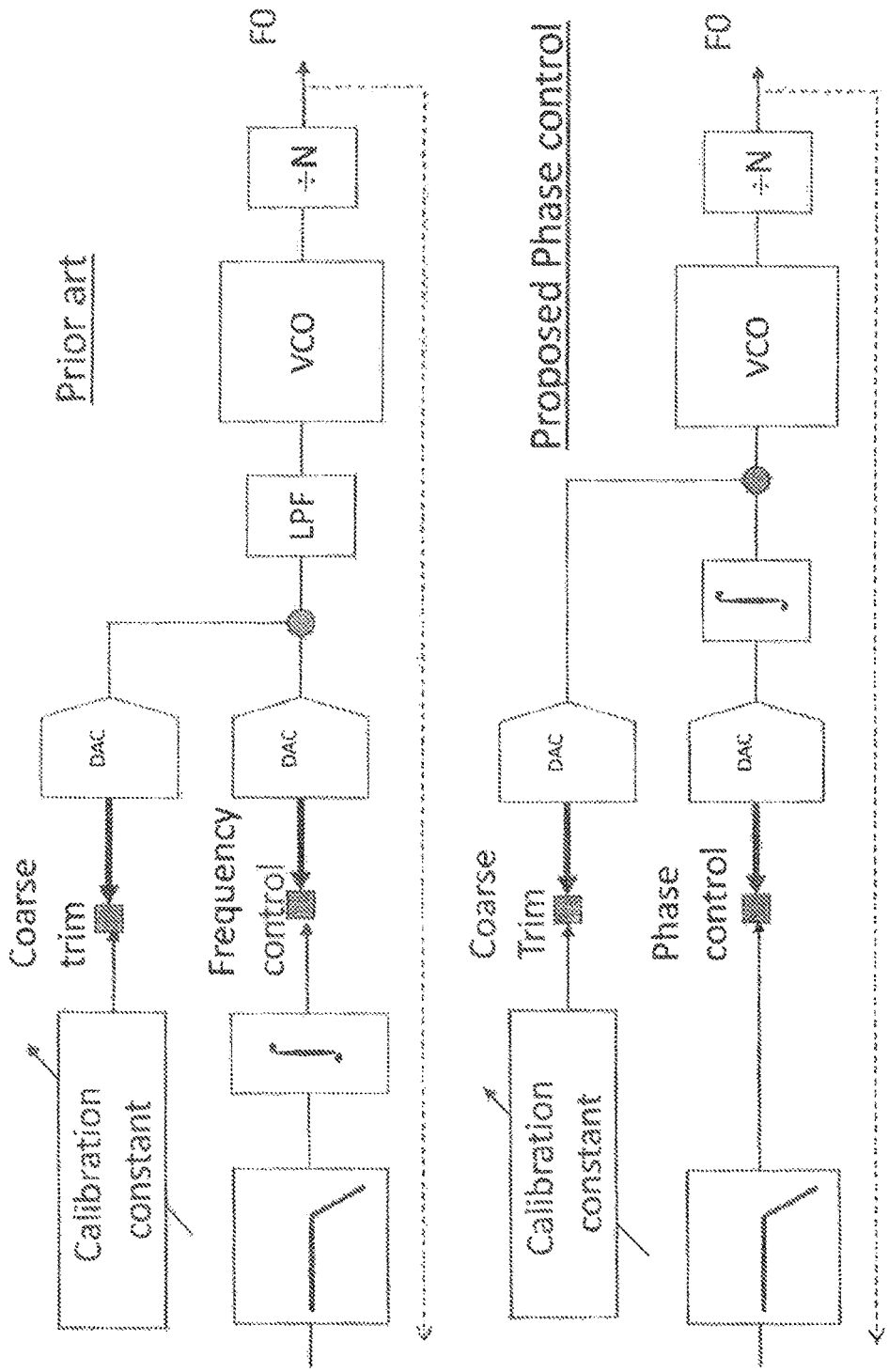
FIG. 8 shows the effect of the invention on system start-up highlighting the need to observe the operating frequency of the VCO to enable to the initial frequency to be set correctly prior to the loops locking onto the resonant frequency.

As can be seen from FIG. 8, the effects of the modification of the VCO in the present invention do not affect the overall transfer function of the system, so do not change the basic characteristics of the system other than significantly increasing the effective resolution of the PLL control loop. In normal loop operation, the prior art system directly controls the frequency of the VCO, whereas the digital system according to the invention alters the phase by adjusting the rate of change of frequency of the VCO.

The use of a coarse frequency trim, and knowledge of the actual frequency F0 is required by both systems to calibrate for the initial manufacturing tolerances to ensure that the system will start up within a suitable time.

It can be seen from FIG. 8 that the overall loop filter is unchanged by moving the position of the integrator so the system will operate much as it always did (but with fewer quantisation errors).

The prior art systems directly controlled the frequency so it was possible to make the system start up at a frequency close enough to the resonant frequency so that there would be sufficient feedback through the high Q resonator for the loops to lock up quickly after switch on.

Knowledge (observation) of the VCO frequency (F0) is needed for the system of the invention as the frequency is not directly controlled by the DAC (the analogue integrator is imperfect and therefore can ramp off due to DC offset errors). The loop only gets its feedback from the resonator once the frequency is close to its resonant frequency so this initial condition can be ensured by using the F0 feedback. Once the loop has locked onto the correct frequency the F0 feedback is not used by the PLL.

A similar loop diagram can be shown for a Phase Lock Loop system such as in the present invention or the prior art system, wherein the combination of the resonator and the overall loop filtration, with the DVCO, contain the same functions and therefore the overall loop dynamics are very similar. Thus, the present invention provides the same loop effects, but with a much improved accuracy.

This can also be seen in FIG. 8, where the combination of the VCO and loop filter has the same effect in the prior art and the invention.

The invention claimed is:

1. A digital ring gyroscope system comprising:
a gyroscope resonator that is a mechanical vibratory ring structure; and
a digitally controlled voltage controlled oscillator comprising an Nbit digital to analogue convertor arranged to receive a frequency change demand signal as a digital Nbit word that represents a change in a resonant frequency of the gyroscope resonator, and having an output provided via an integrator to a voltage controlled oscillator configured to provide a frequency output.

2. The digital ring gyroscope system as claimed in claim 1 wherein the voltage controlled oscillator is configured to provide an in-phase frequency output and a quadrature phase frequency signal output.

3. The digital ring gyroscope system as claimed in claim 1 wherein the voltage controlled oscillator is configured to generate frequencies which are a multiple of a resonator frequency.

4. The digital ring gyroscope system as claimed in claim 1, wherein a gain of the integrator and an output range of the voltage controlled oscillator can be selected to independently optimize frequency range and phase adjustment resolution.

5. The digital ring gyroscope system as claimed in claim 1 with a frequency coarse trim to remove process errors and match the frequency to the gyroscope resonator to enhance the start-up timings.

6. The digital ring gyroscope system as claimed in claim 1 where the integrator is pre-set to mid range prior to a start-up sequence to enhance start-up timings.

\* \* \* \* \*